(12) United States Patent
Hancu et al.

(10) Patent No.: US 7,252,787 B2
(45) Date of Patent: Aug. 7, 2007

(54) GARNET PHOSPHOR MATERIALS HAVING ENHANCED SPECTRAL CHARACTERISTICS

(75) Inventors: Dan Hancu, Clifton Park, NY (US); Alok Mani Srivastava, Niskayuna, NY (US); Gopi Chandran, Bangalore (IN); Holly Ann Comanzo, Niskayuna, NY (US); Shankar Venugopal, Bangalore (IN); Anant Achyut Setlur, Niskayuna, NY (US); Linda Briel, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 343 days.

(21) Appl. No.: 10/910,991

(22) Filed: Aug. 4, 2004

(65) Prior Publication Data

US 2005/0093431 A1    May 5, 2005

Related U.S. Application Data

(63) Continuation-in-part of application No. 10/696,637, filed on Oct. 29, 2003, now Pat. No. 7,094,362.

(51) Int. Cl.
*H05B 33/12* (2006.01)
*H05B 33/14* (2006.01)
*C09K 11/79* (2006.01)
*C09K 11/80* (2006.01)

(52) U.S. Cl. .............................. 252/301.4 R; 313/503; 257/98; 252/301.4 F; 252/301.6 F; 252/301.4 H; 252/301.4 P; 252/301.6 P; 252/301.4 S; 252/301.5

(58) Field of Classification Search ................ 313/503; 257/98; 252/301.4 R, 301.4 F, 301.6 F, 252/301.4 H, 301.4 P, 301.6 P, 301.4 S, 252/301.5
See application file for complete search history.

(56) References Cited

U.S. PATENT DOCUMENTS

| 4,550,256 A | * | 10/1985 | Berkstresser et al. .... 250/483.1 |
| 5,998,925 A | | 12/1999 | Shimizu et al. |
| 6,069,440 A | | 5/2000 | Shimizu et al. |
| 6,203,726 B1 | | 3/2001 | Danielson et al. |
| 6,335,548 B1 | | 1/2002 | Roberts et al. |

(Continued)

FOREIGN PATENT DOCUMENTS

JP   2003-64358   3/2003

(Continued)

OTHER PUBLICATIONS

Pinalli et al., abstract for "Study of the visible spectra of Ca3Sc3Ge3O12 garent crystals doped with Ce3+ or Pr3+", Aug. 23, 2003, Optical Materials, vol. 25, Issue 1, pp. 91-99.

(Continued)

*Primary Examiner*—C. Melissa Koslow
(74) *Attorney, Agent, or Firm*—Fay Sharpe LLP

(57) ABSTRACT

Phosphor compositions having the formula $(Y_{1-x-y-z}Tb_xGd_yCe_z)_3(M_1M_2)_t(Al_{1-r-s}Ga_rIn_s)_{A-2t}O_{12+D}$, where $M_1$ is Mg or Zn, $M_2$ is Si or Ge, $0<x+y<1$, $0.01<z<0.1$, $0.1<t<1.5$, $0<r$, $s<0.5$, $4.5<A<5.0$, and $-1<D<1$. Also disclosed are light emitting devices including a light source and at least one phosphor having the above formula. Such phosphors exhibit a deeper red emission when compared to conventional TAG phosphors, allowing the production of white light sources having improved properties.

21 Claims, 5 Drawing Sheets

U.S. PATENT DOCUMENTS

| | | |
|---|---|---|
| 6,351,069 B1 | 2/2002 | Lowery et al. |
| 6,409,938 B1 | 6/2002 | Cumanzo |
| 6,504,179 B1 | 1/2003 | Ellens et al. |
| 6,538,371 B1 | 3/2003 | Duggal et al. |
| 6,552,487 B1 | 4/2003 | Ellens et al. |
| 6,596,195 B2 | 7/2003 | Srivastava et al. |
| 6,669,866 B1 | 12/2003 | Kummer et al. |
| 7,029,602 B2 * | 4/2006 | Oshio .................. 252/301.4 R |
| 2002/0195587 A1* | 12/2002 | Srivastava et al. .... 252/301.4 R |
| 2004/0159846 A1 | 8/2004 | Doxsee et al. |
| 2004/0188655 A1 | 9/2004 | Wu et al. |
| 2004/0251809 A1 | 12/2004 | Shimomura et al. |
| 2005/0156496 A1 | 7/2005 | Takashima et al. |
| 2005/0242329 A1* | 11/2005 | Fiedler et al. .............. 252/500 |

FOREIGN PATENT DOCUMENTS

| | | |
|---|---|---|
| WO | WO 00/33390 | 6/2000 |
| WO | WO 01/08452 | 2/2001 |
| WO | WO 01/93342 A1 | 12/2001 |
| WO | WO 02/099902 A1 | 12/2002 |
| WO | WO 03 102113 A1 | 12/2003 |
| WO | WO 2005/044947 | 5/2005 |
| WO | WO 2006/008935 A1 | 1/2006 |

OTHER PUBLICATIONS

Cheng-Huang Kuo et al., "n-UV+Blue/Green/Red White Light Emitting Diode Lamps", Jpn. J. Appl. Phys., vol. 42 (2003) pp. 2284-2287, Part 1. No. 4B, Apr. 2003, The Japan Society of Applied Physics.

Young-Duk Huh, et al., "Optical Properties of Three-Band White Light Emitting Diodes" Journal of The Electrochemical Society, 150(2) H57-H60 (Jan. 2003).

* cited by examiner

GARNET PHOSPHOR MATERIALS HAVING ENHANCED SPECTRAL CHARACTERISTICS

This application is a continuation-in-part application (CIP) of U.S. patent application Ser. No. 10/696,637 filed on Oct. 29, 2003, now U.S. Pat. No. 7,094,362, issued Aug. 22, 2006.

BACKGROUND

The present exemplary embodiments relate to phosphor compositions, particularly phosphors for use in lighting applications. More particularly, the present exemplary embodiments relate to garnet phosphors having enhanced emissions in defined spectral regions compared to conventional garnet phosphors and a lighting apparatus employing these phosphors. They find particular application in conjunction with the conversion of LED-generated ultraviolet (UV), violet or blue radiation for general illumination purposes. It should be appreciated, however, that the invention is also amenable to other like applications.

Light emitting diodes (LEDs) are semiconductor light emitters often used as a replacement for other light sources, such as incandescent lamps. They are particularly useful as display lights, warning lights and indicating lights or in other applications where colored light is desired. The color of light produced by an LED is dependent on the type of semiconductor material used in its manufacture.

Colored semiconductor light emitting devices, including light emitting diodes and lasers (both are generally referred to herein as LEDs), have been produced from Group III-V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and host inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum, may be generated. Colored LEDs are often used in toys, indicator lights and other devices. Manufacturers are continuously looking for new colored phosphors for use in such LEDs to produce custom colors and higher luminosity.

In addition to colored LEDs, a combination of LED generated light and phosphor generated light may be used to produce white light. The most popular white LEDs are based on blue emitting GaInN chips. The blue emitting chips are coated with a phosphor that converts some of the blue radiation to a complementary color, e.g. a yellow-green emission. The total of the light from the phosphor and the LED chip provides a color point with corresponding color coordinates (x and y) and correlated color temperature (CCT), and its spectral distribution provides a color rendering capability, measured by the color rendering index (CRI).

One known white light emitting device comprises a blue light-emitting LED having a peak emission wavelength in the blue range (from about 440 nm to about 480 nm) combined with a phosphor, such as cerium doped yttrium aluminum garnet $Y_3Al_5O_{12}$: $Ce^{3+}$ ("YAG"). The phosphor absorbs a portion of the radiation emitted from the LED and converts the absorbed radiation to a yellow-green light. The remainder of the blue light emitted by the LED is transmitted through the phosphor and is mixed with the yellow light emitted by the phosphor. A viewer perceives the mixture of blue and yellow light as a white light.

Such systems can be used to make white light sources having correlated color temperatures (CCTs) of >4500 K and color rendering indicies (CRIs) ranging from about 75-82. While this range is suitable for many applications, general illumination sources usually require higher CRIs and lower CCTs. One method of achieving this in blue LED devices requires that the phosphor emission be enhanced in the red spectral region compared to current yellow emission of conventional phosphors.

To accomplish this, phosphor blends utilizing deep red phosphors are sometimes used to produce light sources having a high color rendering index (CRI). Two deep red phosphors currently being used in such applications are $(Ca,Sr)S:Eu^{2+}$ and $(Ba,Sr,Ca)_xSi_yN_z:Eu^{2+}$, where 0<x,y,z. While effective, such phosphors may reabsorb emission from other phosphors, such as $(Tb,Y)_3Al_5O_{12}$: $Ce^{3+}$ ("TAG") or YAG, that may be present in the illumination device due to the overlapping of the $Eu^{2+}$ absorption bands in these materials with the emission of the other phosphors. Thus, a need exists for a new phosphor having a redder emission than TAG:Ce phosphors for use in LEDs displaying high quantum efficiency to produce both colored and white-light LEDs having a high CRI.

BRIEF DESCRIPTION

In accordance with a first aspect of the present exemplary embodiment, there is provided a phosphor having the formula $(Y_{1-x-y-z}Tb_xGd_yCe_z)_3(M_1M_2)_t(Al_{1-r-s}Ga_rIn_s)_{A-2t}O_{12+D}$, where $M_1$ is Mg or Zn, $M_2$ is Si or Ge, 0<x+y<1, 0.01<z<0.1, 0.1<t<1.5, 0<r, s<0.5, 4.5<A<5.0, and −1<D<1.

In a second aspect, there is provided a white-light emitting device including a semiconductor light source having a peak emission from about 250 to about 550 nm and a phosphor having the formula $(Y_{1-x-y-z}Tb_xGd_yCe_z)_3(M_1M_2)_t(Al_{1-r-s}Ga_rIn_s)_{A-2t}O_{12+D}$, where $M_1$ is Mg or Zn, $M_2$ is Si or Ge, 0<x+y<1, 0.01<z<0.1, 0.1<t<1.5, 0<r, s<0.5, 4.5<A<5.0, and −1<D<1.

In a third aspect, there is provided a phosphor blend including a first phosphor having the formula $(Y_{1-x-y-z}Tb_xGd_yCe_z)_3(M_1M_2)_t(Al_{1-r-s}Ga_rIn_s)_{A-2t}O_{12+D}$, where $M_1$ is Mg or Zn, $M_2$ is Si or Ge, 0<x+y<1, 0.01<z<0.1, 0.1<t<1.5, 0<r, s<0.5, 4.5<A<5.0, and −1<D<1.

DETAILED DESCRIPTION OF THE INVENTION

Phosphors convert radiation (energy) to visible light. Different combinations of phosphors provide different colored light emissions. The colored light that originates from the phosphors provides a color temperature. Novel phosphor compositions are presented herein as well as their use in LED and other light sources.

A phosphor conversion material (phosphor material) converts generated UV or blue radiation to a different wavelength visible light. The color of the generated visible light is dependent on the particular components of the phosphor material. The phosphor material may include only a single phosphor composition or two or more phosphors of basic color, for example a particular mix with one or more of a yellow and red phosphor to emit a desired color (tint) of light. As used herein, the term "phosphor material" is intended to include both a single phosphor as well as a blend of two or more phosphors.

It was determined that an LED lamp that produces a bright-white light would be useful to impart desirable qualities to LEDs as light sources. Therefore, in one embodiment of the invention, a luminescent material phosphor conversion material blend (phosphor blend) coated LED is disclosed for providing white light. The individual phosphors and a phosphor blend including the individual phosphors convert radiation at a specified wavelength, for example radiation from about 250 to 550 nm as emitted by a near UV or blue LED, into visible light. The visible light provided by the phosphor blend comprises a bright white light with high intensity and brightness.

Figure 1:
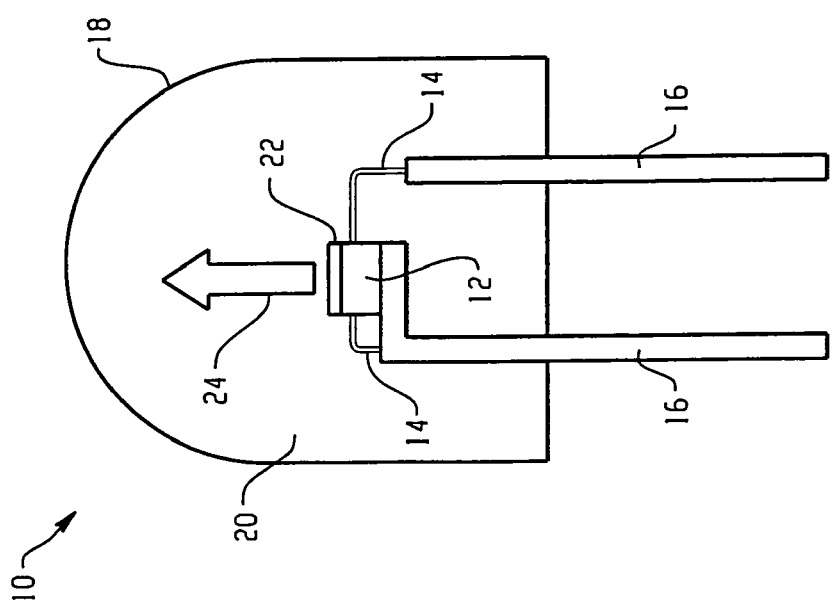
FIG. 1 is a schematic cross-sectional view of an illumination system in accordance with one embodiment of the present invention.

With reference to FIG. 1, an exemplary light emitting assembly or lamp 10 is shown in accordance with one preferred structure of the present invention. The light emitting assembly 10 comprises a semiconductor UV radiation source, such as a light emitting diode (LED) chip 12 and leads 14 electrically attached to the LED chip. The leads 14 may comprise thin wires supported by a thicker lead frame(s) 16 or the leads may comprise self supported electrodes and the lead frame may be omitted. The leads 14 provide current to the LED chip 12 and thus cause the LED chip 12 to emit radiation.

The lamp may include any semiconductor blue or UV light source that is capable of producing white light when its emitted radiation is directed onto the phosphor. In a preferred embodiment, the semiconductor light source comprises a blue emitting LED doped with various impurities. Thus, the LED may comprise a semiconductor diode based on any suitable III-V, II-VI or IV-IV semiconductor layers and having an emission wavelength of about 250 to 550 nm. Preferably, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and $i+j+k=1$) having an emission wavelength greater than about 250 nm and less than about 550 nm. Preferably, the chip is a blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

Organic light emissive structures are known in the art. A common high-efficiency organic emissive structure is referred to as the double heterostructure LED. This structure is very similar to conventional, inorganic LED's using materials as GaAs or InP. In this type of device, a support layer of glass is coated by a thin layer of indium/tin oxide (ITO) to form the substrate for the structure. Next, a thin (100-500 Å) organic, predominantly hole-transporting, layer (HTL) is deposited on the ITO layer. Deposited on the surface of the HTL layer is a thin (typically, 50-100 Å) emissive layer (EL). If these layers are too thin, there may be breaks in the continuity of the film; as the thickness of the film increases, the internal resistance increases, requiring higher power consumption for operation. The emissive layer (EL) provides the recombination site for electrons, injected from a 100-500 Å thick electron transporting layer (ETL) that is deposited upon the EL, and holes from the HTL layer. The ETL material is characterized by considerably higher mobility for electrons than for charge deficient centers (holes).

Another known organic emissive structure is referred to as a single heterostructure. The difference in this structure relative to that of the double heterostructure is that the electroluminescent layer also serves as an ETL layer, eliminating the need for the ETL layer. However, this type of device, for efficient operation, must incorporate an EL layer having good electron transport capability, otherwise a separate ETL layer must be included, rendering the structure effectively the same as a double heterostructure.

A known alternative device structure for an LED is referred to as a single layer (or polymer) LED. This type of device includes a glass support layer coated by a thin ITO layer, forming the base substrate. A thin organic layer of spin-coated polymer, for example, is then formed over the ITO layer, and provides all of the functions of the HTL, ETL, and EL layers of the previously described devices. A metal electrode layer is then formed over the organic polymer layer. The metal is typically Mg, Ca, or other conventionally used metals.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other high index of refraction material. Preferably, the encapsulant material 20 is an epoxy or a polymer material, such as silicone. Both the shell 18 and the encapsulant 20 are preferably transparent or substantially optically transmissive with respect to the wavelength of light produced by the LED chip 12 and a phosphor composition 22 (described below). Alternately, the lamp may 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor composition 22 radiationally coupled to the LED chip 12. Radiationally coupled means that the elements are associated with each other so radiation from one is transmitted to the other. In a preferred embodiment, the phosphor composition 22 is a blend of two or more phosphors, as will be detailed below. This phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of the phosphor composition 22 and LED 12. Thus, the phosphor composition 22 may be coated over or directly on the light emitting surface of the LED chip 12 by coating and drying the phosphor suspension over the LED chip 12. Both the shell 18 and the encapsulant 20 should be transparent to allow white light 24 to be transmitted through those elements. Although not intended to be limiting, in one embodiment, the median particle size of the phosphor composition may be from about 1 to about 10 microns.

Figure 2:
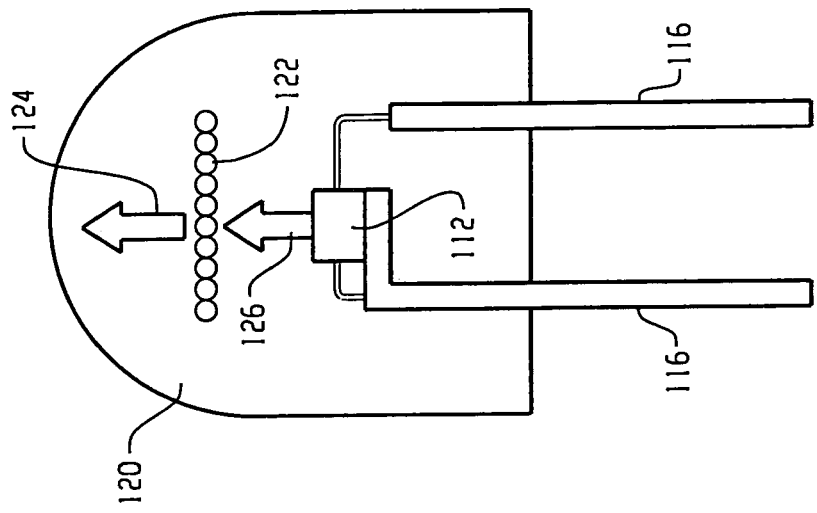
FIG. 2 is a schematic cross-sectional view of an illumination system in accordance with a second embodiment of the present invention.

FIG. 2 illustrates a second preferred structure of the system according to the preferred aspect of the present invention. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material 120 or, more preferably, throughout the entire volume of the encapsulant material. Blue light 126 emitted by the LED chip 112 mixes with the light emitted by the phosphor composition 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer loading.

Figure 3:
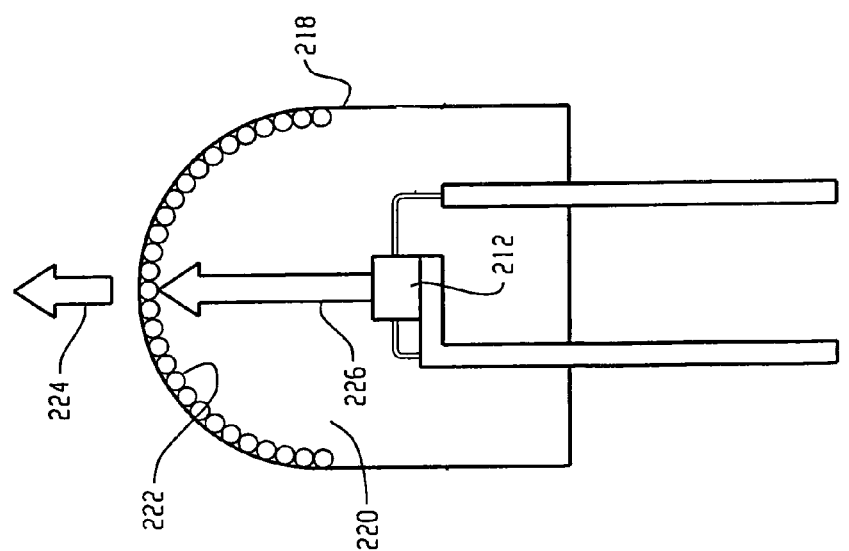
FIG. 3 is a schematic cross-sectional view of an illumination system in accordance with a third embodiment of the present invention.

FIG. 3 illustrates a third preferred structure of the system according to the preferred aspects of the present invention. The structure of the embodiment shown in FIG. 3 is similar to that of FIG. 1, except that the phosphor composition 222 is coated onto a surface of the shell 218, instead of being formed over the LED chip 212. The phosphor composition is preferably coated on the inside surface of the shell 218, although the phosphor may be coated on the outside surface of the shell, if desired. The phosphor composition 222 may be coated on the entire surface of the shell or only a top portion of the surface of the shell. The UV light 226 emitted by the LED chip 212 mixes with the light emitted by the phosphor composition 222, and the mixed light appears as white light 224. Of course, the structures of FIGS. 1-3 may be combined and the phosphor may be located in any two or all three locations or in any other suitable location, such as separately from the shell or integrated into the LED.

In any of the above structures, the lamp 10 may also include a plurality of scattering particles (not shown), which are embedded in the encapsulant material. The scattering particles may comprise, for example, $Al_2O_3$ particles such as alumina powder or $TiO_2$ particles. The scattering particles effectively scatter the coherent light emitted from the LED chip, preferably with a negligible amount of absorption.

Figure 4:
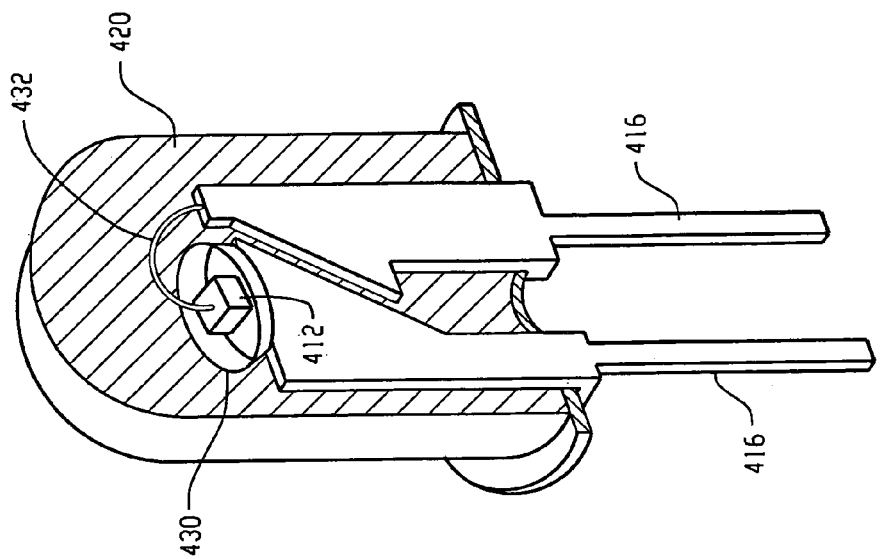
FIG. 4 is a cutaway side perspective view of an illumination system in accordance with a fourth embodiment of the present invention.

As shown in a fourth preferred structure in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

In one embodiment, the invention provides a novel phosphor composition, which may be used in the phosphor composition 22 in the above described LED light, having the general formula $(Y_{1-x-y-z}Tb_xGd_yCe_z)_3(M_1M_2)_t(Al_{1-r-s}Ga_rIn_s)_{A-2t}O_{12+D}$, where $M_1$ is Mg or Zn, $M_2$ is Si or Ge, $0<x+y<1$, $0.01<z<0.1$, $0.1<t<1.5$, $0<r$, $s<0.5$, $4.5<A<5.0$, and $-1<D<1$. A particularly preferred phosphor composition has the formula $(Y_{0.49}Gd_{0.48}Ce_{0.03})_3(MgSi)_{1.5}Al_2O_{12}$. A preferred non-stoichiometric phosphor is $(Y_{0.49}Gd_{0.48}Ce_{0.03})_3(MgSi)_{1.5}Al_{1.9}O_{11.7})$. When used with an LED emitting at from 350 to 550 nm and one or more other appropriate phosphors, the resulting lighting system will produce a light having a white color, the characteristics of which will be discussed in more detail below.

Figure 5:
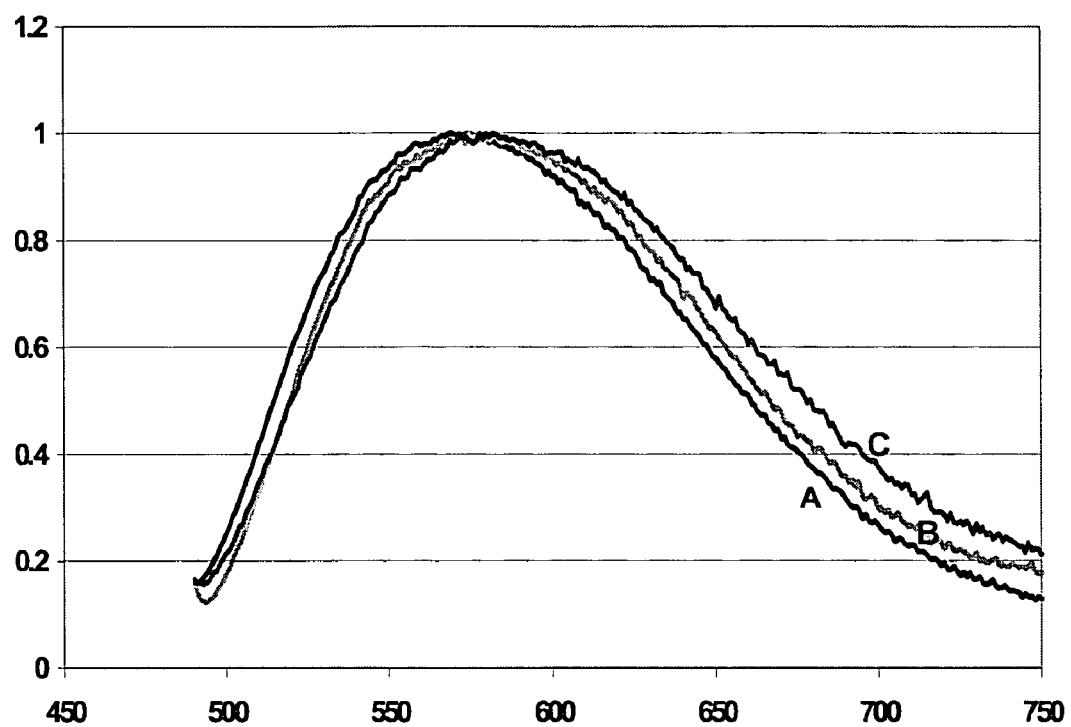
FIG. 5 is a graph of the emission spectra of under 470 nm excitation of various substituted phosphors: (A)-$(Y_{0.77}Tb_{0.2}Ce_{0.03})_3(MgSi)Al_3O_{12}$, (B)-$(Y_{0.17}Tb_{0.8}Ce_{0.03})_3(MgSi)Al_3O_{12}$, and (C)-$(Y_{0.77}Tb_{0.2}Ce_{0.03})_3(MgSi)_{1.5}Al_2O_{12}$.

The above described formulation produces a phosphor with an emission having a deeper red component as compared to conventional TAG phosphor by shifting the $Ce^{3+}$ emission to a deeper red (i.e. longer) wavelength with the partial substitutions of Y with Gd and/or Tb and Al with Mg—Si. This is shown in table 1 and FIG. 5. Table 1 shows the effect of substituting Tb for Y and (SiMg) for Al in $Ce^{3+}$ activated YAG. Table 1 lists the maximum wavelength emission of $(Y_{0.97-x}Tb_xCe_{0.03})_3(MgSi)_tAl_{5-2t}O_{12}$ under 470 nm excitation as a function of x and t. FIG. 5 shows the emission spectrums under 470 nm excitation of various substituted phosphors with spectra A representing $(Y_{0.77}Tb_{0.2}Ce_{0.03})_3(MgSi)Al_3O_{12}$, spectra B representing $(Y_{0.17}Tb_{0.8}Ce_{0.03})_3(MgSi)Al_3O_{12}$, and spectra C representing $(Y_{0.77}Tb_{0.2}Ce_{0.03})_3(MgSi)_{1.5}Al_2O_{12}$.

TABLE 1

| x | t | Max. wavelength @ 470 nm excitation |
|---|---|---|
| 0.2 | 1 | 569 |
| 0.4 | 1 | 573 |
| 0.6 | 1 | 574 |
| 0.8 | 1 | 575 |

TABLE 1-continued

| x | t | Max. wavelength @ 470 nm excitation |
|---|---|---|
| 0.2 | 1.25 | 571 |
| 0.4 | 1.25 | 571 |
| 0.6 | 1.25 | 574 |
| 0.8 | 1.25 | 582 |
| 0.2 | 1.5 | 582 |
| 0.4 | 1.5 | 583 |
| 0.6 | 1.5 | 583 |
| 0.8 | 1.5 | 591 |

Similarly, Table 2 shows the effect of substituting Tb and/or Gd for Y and (SiMg) for Al in $Ce^{3+}$ activated YAG. Table 2 lists the maximum wavelength emission of such a phosphor under 470 nm excitation as a function of the concentration of Y, Tb, Gd, Ce, Mg and Si, and Al.

TABLE 2

| Y | Tb | Gd | Ce | Mg | Si | Al | Wavelength |
|---|---|---|---|---|---|---|---|
| 1.46 | 0.00 | 1.45 | 0.09 | 1.50 | 1.50 | 2.0 | 600 |
| 0.98 | 0.97 | 0.97 | 0.09 | 1.50 | 1.50 | 2.0 | 594 |
| 0.01 | 0.00 | 2.90 | 0.09 | 0.80 | 0.80 | 3.4 | 594 |
| 0.01 | 2.90 | 0.00 | 0.09 | 1.15 | 1.15 | 2.7 | 592 |
| 0.01 | 0.97 | 1.93 | 0.09 | 1.50 | 1.50 | 2.0 | 590 |

Figure 6:
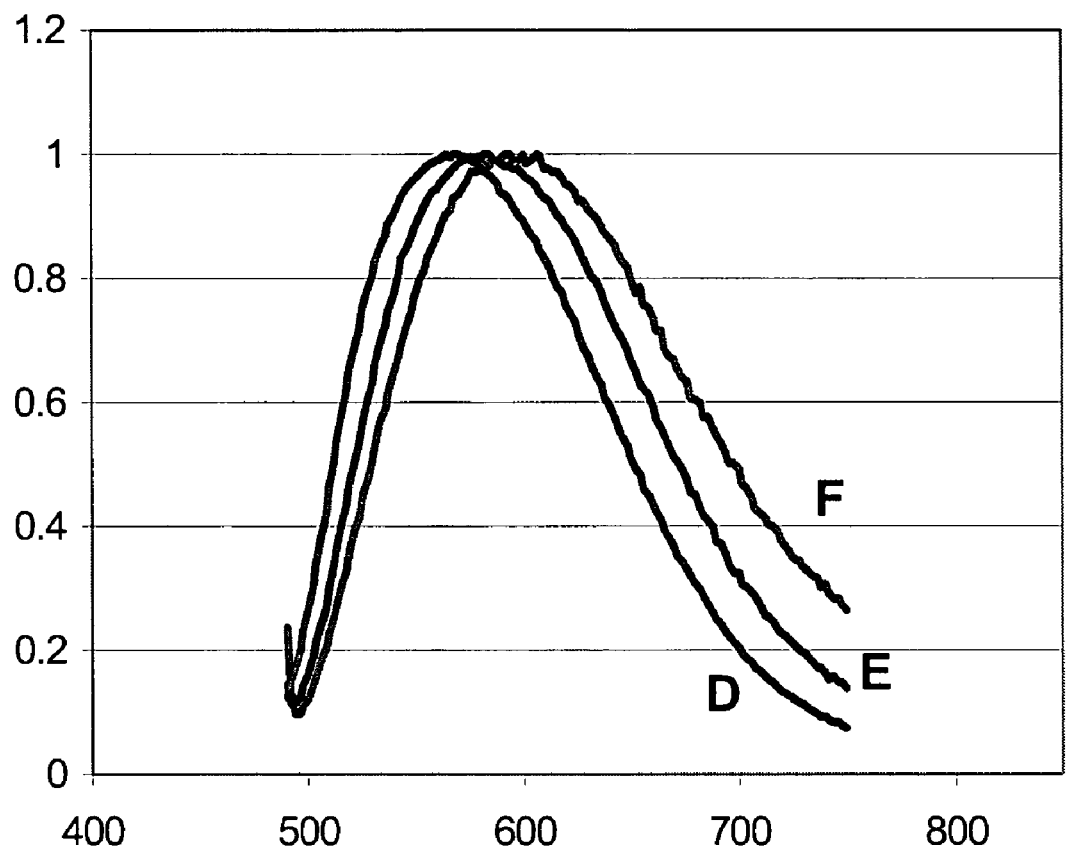
FIG. 6 is a graph of the emission spectra of various substituted YAG phosphors: (D)-$(Y_{0.97}Ce_{0.03})_3(MgSi)_{0.75}Al_{3.5}O_{12}$, (E)-$(Y_{0.57}Tb_{0.4}Ce_{0.03})_3(MgSi)_{1.25}Al_{2.5}O_{12}$, and (F)-$(Y_{0.49}Gd_{0.48}Ce_{0.03})_3(MgSi)_{1.5}Al_2O_{12}$.

FIG. 6 shows the emission spectra of various substituted YAG phosphors under 470 nm excitation. Spectra (D) shows a YAG phosphor in which Al is partially substituted with Mg—Si having the formula $(Y_{0.97}Ce_{0.03})_3(MgSi)_{0.75}Al_{3.5}O_{12}$, spectra (E) shows a YAG phosphor in which Y is partially substituted with Tb and in which Al is partially substituted with Mg-Si having the formula $(Y_{0.57}Tb_{0.4}Ce_{0.03})_3(MgSi)_{1.25}Al_{2.5}O_{12}$, and spectra (F) shows a YAG phosphor in which Y is partially substituted with Gd and in which Al is partially substituted with Mg—Si having the formula $(Y_{0.49}Gd_{0.48}Ce_{0.03})_3(MgSi)_{1.5}Al_2O_{12}$. It can be seen that the modified YAG phosphors having a portion of Y substituted by Tb and/or Gd as well as Al substituted with Mg—Si shifts the emission maximum towards the red compared to a conventional TAG phosphor.

Figure 7:
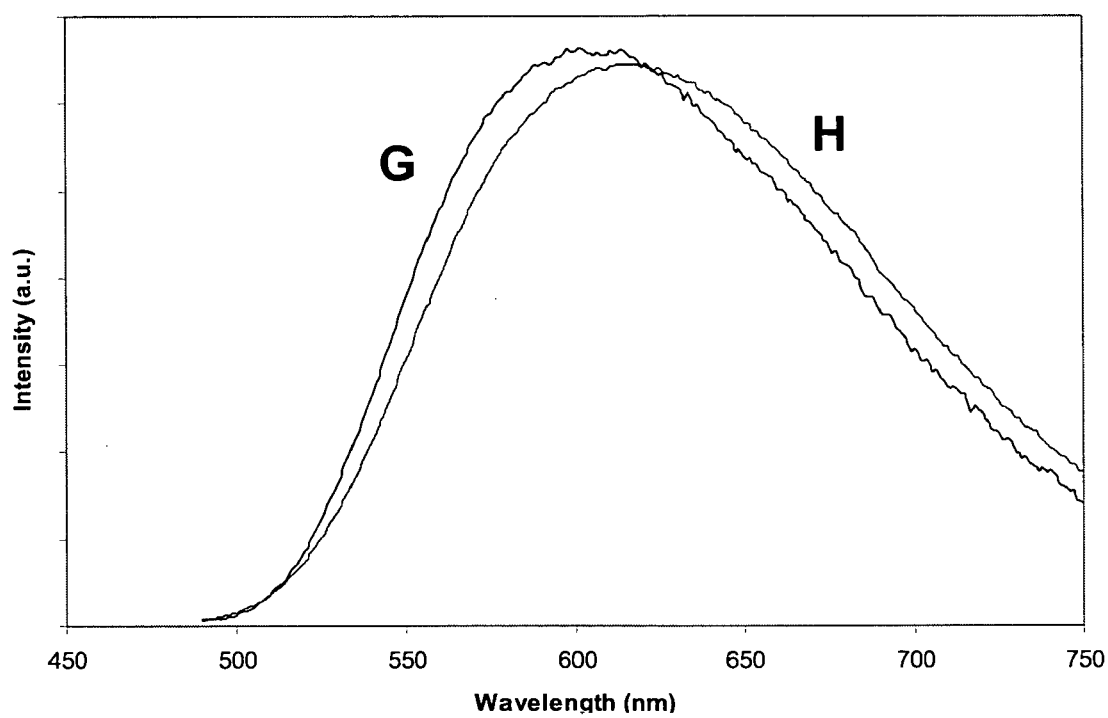
FIG. 7 is a graph of the emission spectra of a phosphor having the formula $(Y_{0.49}Gd_{0.48}Ce_{0.03})_3(MgSi)_{1.5}Al_2O_{12}$ (H) compared to the emission spectra of $Lu_{1.88}Ce_{0.12}CaMg_2Si_3O_{12}$ (G).

FIG. 7 shows the emission spectra (H) of an exemplary phosphor according to the present embodiments having the formula $(Y_{0.49}Gd_{0.48}Ce_{0.03})_3(MgSi)_{1.5}Al_2O_{12}$ compared to the emission spectra (G) of a similarly substituted phosphor having a garnet major phase and a secondary silicate phase and having the formula $Lu_{1.88}Ce_{0.12}CaMg_2Si_3O_{12}$ under 470 nm excitation. The Gd substituted phosphor has an even deeper red emission than the Lu substituted phosphor, which in turn was identified in the previously identified parent application as having a deeper red (higher wavelength) emission that conventional TAG phosphors.

When combined with a LED emitting at from 350-550 nm and, optionally, one or more additional phosphors, the use of the above phosphor allows for a white LED device having a higher CRI value and lower CCT as compared to a TAG based lighting device. LED devices having CCT values from about 2500 to about 10000, preferably from 2500 to 4500, and high CRI values from about 70 to 95 can be made. This allows for an increased ccx coordinate and a reduced ccy coordinate on the CIE color chromaticity diagram for the LED device, resulting in a "warmer" color LED.

The above described phosphors may contain optically inert trace impurities including, for example, apatites such as $Ln_{9.33}(SiO_4)_6O_2$, and well as other silicates, such as $Ln_2Si_2O_7$ or $Ln_2SiO_5$. The presence of such impurities in an amount up to 10% by weight of the phosphor composition will not significantly affect the quantum efficiency or color of the phosphor.

It may be desirable to add pigments or filters to the phosphor material. The phosphor layer 22 may also comprises from 0 up to about 5% by weight (based on the total weight of the phosphors) of a pigment or other UV absorbent material capable of absorbing UV radiation having a wavelength between 250 nm and 450 nm.

Suitable pigments or filters include any of those known in the art that are capable of absorbing radiation generated between 250 nm and 450 nm. Such pigments include, for example, nickel titanate or praseodimium zirconate. The pigment is used in an amount effective to filter 10% to 100% of the radiation generated in the 250 nm to 450 nm range.

The above described phosphor compositions may be produced using known solid state reaction processes for the production of phosphors by combining, for example, elemental oxides, carbonates and/or hydroxides as starting materials. Other starting materials may include nitrates, sulfates, acetates, citrates, or oxalates. Alternately, coprecipitates of the rare earth oxides could be used as the starting materials for the RE elements. Si may be provided via $SiO_2$, silicic acid, or other sources such as fumed silica.

In one exemplary process of making the above phosphors, an array slurry method is used. Raw materials (such as $Y_2O_3$, $Gd_2O_3$, $Tb_4O_7$, $CeO_2$, MgO, $SiO_2$, and $Al_2O_3$) are milled down to micron size powders and then dispersed in water up to 16% by weight solid loading. The slurries may be dispensed into alumina crucibles via a commercial liquid handler under vigorous mixing. The homogenous solid mixture resulted after water evaporation after firing the slurries at 1200-1700° C. under a reducing atmosphere (e.g. 1% $H_2$ in air).

In another typical process, the starting materials are combined via a dry or wet blending process and fired in air or under a reducing atmosphere at from, e.g., 1000 to 1600° C. A fluxing agent may be added to the mixture before or during the step of mixing. This fluxing agent may be $AlF_3$, $NH_4Cl$ or any other conventional fluxing agent, such as a fluoride of at least one metal selected from the group consisting of terbium, aluminum, gallium, and indium. A quantity of a fluxing agent of less than about 20, preferably less than about 10, percent by weight of the total weight of the mixture is adequate for fluxing purposes.

The starting materials may be mixed together by any mechanical method including, but not limited to, stirring or blending in a high-speed blender or a ribbon blender. The starting materials may be combined and pulverized together in a bowl mill, a hammer mill, or a jet mill. The mixing may be carried out by wet milling especially when the mixture of the starting materials is to be made into a solution for subsequent precipitation. If the mixture is wet, it may be dried first before being fired under a reducing atmosphere at a temperature from about 900° C. to about 1700° C., preferably from about 1000° C. to about 1600° C., for a time sufficient to convert all of the mixture to the final composition.

The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate. The reducing atmosphere typically comprises a reducing gas such as hydrogen, carbon monoxide, or a combination thereof, optionally diluted with an inert gas, such as nitrogen or helium, or a combination thereof. Alternatively, the crucible containing the mixture may be packed in a second closed crucible containing high-purity carbon particles and fired in air so that the carbon particles react with the oxygen present in air, thereby, generating carbon monoxide for providing a reducing atmosphere.

These compounds may be blended and dissolved in a nitric acid solution. The strength of the acid solution is chosen to rapidly dissolve the oxygen-containing compounds and the choice is within the skill of a person skilled in the art. Ammonium hydroxide is then added in increments to the acidic solution. An organic base such as methanolamine, ethanolamine, propanolamine, dimethanolamine, diethanolamine, dipropanolamine, trimethanolamine, triethanolamine, or tripropanolamine may be used in place of ammonium hydroxide.

The precipitate is filtered, washed with deionized water, and dried. The dried precipitate is ball milled or otherwise thoroughly blended and then calcined in air at about 400° C. to about 1600° C. for a sufficient time to ensure a substantially complete dehydration of the starting material. The calcination may be carried out at a constant temperature. Alternatively, the calcination temperature may be ramped from ambient to and held at the final temperature for the duration of the calcination. The calcined material is similarly fired at 1000-1600° C. for a sufficient time under a reducing atmosphere such as $H_2$, CO, or a mixture of one of these gases with an inert gas, or an atmosphere generated by a reaction between a coconut charcoal and the products of the decomposition of the starting materials to covert all of the calcined material to the desired phosphor composition.

While suitable in many applications alone with a blue or UV LED chip, the above two phosphor compositions may be blended with each other or one or more additional phosphors for use in LED light sources. Thus, in another embodiment, an LED lighting assembly is provided including a phosphor composition 22 comprising a blend of a phosphor from one of the above embodiments with one or more additional phosphors. When used in a lighting assembly in combination with a blue or near UV LED emitting radiation in the range of about 250 to 550 nm, the resultant light emitted by the assembly will be a white light. In one embodiment, the phosphor composition comprises a blend of $(Y_{1-x-y-z}Tb_xGd_yCe_z)_3(M_1M_2)_t(Al_{1-r-s}Ga_rIn_s)_{A-2t}O_{12+D}$, as described above, and a TAG:Ce phosphor, and optionally one or more additional phosphors.

In another preferred embodiment, the phosphor composition includes a blend of any combination of $(Y_{1-x-y-z}Tb_xGd_yCe_z)_3(M_1M_2)_t(Al_{1-r-s}Ga_rIn_s)_{A-2t}O_{12+D}$, as described above, and TAG:Ce along with a blue-green phosphor and a red phosphor. The relative amounts of each phosphor in the phosphor composition can be described in terms of spectral weight.

The spectral weight is the relative amount that each phosphor contributes to the overall emission spectrum of the device. The spectral weight amounts of all the individual phosphors and any residual bleed from the LED source should add up to 1.0 (i.e. 100%). In a preferred embodiment, each of the above described phosphors in the blend will have a spectral weight ranging from about 0.001 to 0.75. A preferred blend comprises a spectral weight of from 0.001 to 0.200 for the blue-green phosphor, from 0.001 to 0.300 of the red phosphor, and the balance of the blend being $(Y_{1-x-y-z}Tb_xGd_yCe_z)_3(M_1M_2)_t(Al_{1-r-s}Ga_rIn_s)_{A-2t}O_{12+D}$ and TAG:Ce. Any known blue-green and red phosphor suitable for use in UV or blue LED systems may be used. In addition, other phosphors such as green, blue, orange, or other color phosphors may be used in the blend to customize the white color of the resulting light and produce higher CRI sources. When used in conjunction with a LED chip emitting at from, e.g., 250 to 550 nm, the lighting system preferably includes a blue phosphor for converting some, and preferably all, of the LED radiation to blue light, which in turn can then be efficiently converted by the present inventive phosphors. While not intended to be limiting, suitable phosphor for use in the blend with the present invention phosphors include:

BLUE:

$(Ba,Sr,Ca)_5(PO_4)_3(Cl,F,Br,OH):Eu^{2+},Mn^{2+}, Sb^{3+}$ $(Ba,Sr,Ca)MgAl_{10}O_{17}:Eu^{2+},Mn^{2+}$ $(Ba,Sr,Ca)BPO_5:Eu^{2+},Mn^{2+}$ $(Sr,Ca)_{10}(PO_4)_6*nB_2O_3:Eu^{2+}$; where 0<n $2SrO*0.84P_2O_5*0.16B_2O_3:Eu^{2+}$ $Sr_2Si_3O_8*2SrCl_2:Eu^{2+}$ $Ba_3MgSi_2O_8:Eu^{2+}$ $Sr_4Al_{14}O_{25}:Eu^{2+}$(SAE)

$BaAl_8O_{13}:Eu^{2+}$

BLUE-GREEN:

$Sr_4Al_{14}O_{25}:Eu^{2+}$ $BaAl_8O_{13}:Eu^{2+}$ $2SrO*0.84P_2O_5*0.16B_2O_3:Eu^{2+}$ $(Ba,Sr,Ca)MgAl_{10}O_{17}:Eu^{2+},Mn^{2+}$ $(Ba,Sr,Ca)_5(PO_4)_3(Cl,F,OH):Eu^{2+},Mn^{2+}, Sb^{3+}$

GREEN:

$(Ba,Sr,Ca)MgAl_{10}O_{17}:Eu^{2+},Mn^{2+}$ (BAMn)

$(Ba,Sr,Ca)Al_2O_4:Eu^{2+}$ $(Y,Gd,Lu,Sc,La)BO_3:Ce^{3+},Tb^{3+}$ $Ca_8Mg(SiO_4)_4Cl_2:Eu^{2+},Mn^{2+}$ $(Ba,Sr,Ca)_2SiO_4:Eu^{2+}$ $(Ba,Sr,Ca)_2(Mg,Zn)Si_2O_7:Eu^{2+}$ $(Sr,Ca,Ba)(Al,Ga,In)_2S_4:Eu^{2+}$ $(Y,Gd,Tb,La,Sm,Pr,Lu)_3(Al,Ga)_5O_{12}:Ce^{3+}$ $(Ca,Sr)_8(Mg,Zn)(SiO_4)_4Cl_2: Eu^{2+},Mn^{2+}$ (CASI)

$Na_2Gd_2B_2O_7:Ce^{3+}, Tb^{3+}$ $(Ba,Sr)_2(Ca,Mg,Zn)B_2O_6:K,Ce,Tb$

YELLOW-ORANGE:

$(Sr,Ca,Ba,Mg,Zn)_2P_2O_7:Eu^{2+},Mn^{2+}$ (SPP);

$(Ca,Sr,Ba,Mg)_{10}(PO_4)_6(F,Cl,Br,OH): Eu^{2+},Mn^{2+}$ (HALO);

RED:

$(Gd,Y,Lu,La)_2O_3:Eu^{3+},Bi^{3+}$ $(Gd,Y,Lu,La)_2O_2S:Eu^{3+},Bi^{3+}$ $(Gd,Y,Lu,La)VO_4:Eu^{3+},Bi^{3+}$ $(Ca,Sr)S:Eu^{2+}$ $SrY_2S_4:Eu^{2+}$ $CaLa_2S_4:Ce^{3+}$ $(Ca,Sr)S:Eu^{2+}$ $3.5MgO*0.5MgF_2*GeO_2:Mn^{4+}$ (MFG)

$(Ba,Sr,Ca)MgP_2O_7:Eu^{2+},Mn^{2+}$ $(Y,Lu)_2WO_6:Eu^{3+},Mo^{6+}$ $(Ba,Sr,Ca)_xSi_yN_z:Eu^{2+}$ $(Sr,Ca,Ba)_3MgSi_2O_8:Eu^{2+},Mn^{2+}$

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.30 to about 0.55, and a y value in the range of about 0.30 to about 0.55. As stated, however, the exact identity and amounts of each phosphor in the phosphor composition can be varied according to the needs of the end user.

The phosphor composition described above may be used in additional applications besides LEDs. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are meant to be merely exemplary and not exhaustive.

The invention has been described with reference to various preferred embodiments. Modifications and alteration will occur to others upon a reading and understanding of this specification. The invention is intended to include all such modifications and alterations insofar as they come within the scope of the appended claims or the equivalent thereof.

What is claimed is:

1. A lighting apparatus for emitting white light comprising:
   a light source emitting radiation at from about 250 nm to about 550 nm; and
   a phosphor composition radiationally coupled to the light source, the phosphor composition comprising $(Y_{1-x-y-z}Tb_xGd_yCe_z)_3(M_1M_2)_t(Al_{1-r-s}Ga_rIn_s)_{4-2t}O_{12+D}$, where $M_1$ is Mg or Zn, $M_2$ is Si or Ge, $0<x+y<1$, $0.01<z<0.1$, $0.1<t<1.5$, $0<r$, $s<0.5$, $4.5<A<5.0$, and $-1<D<1$.

2. The lighting apparatus of claim 1, wherein the light source is a semiconductor light emitting diode (LED) emitting radiation having a wavelength in the range of from about 350 to about 550 nm.

3. The lighting apparatus of claim 2, wherein the LED comprises a nitride compound semiconductor represented by the formula $In_iGa_jAl_kN$, where $0 \leq i$; $0 \leq j$, $0 \leq K$, and $i+j+k=1$.

4. The lighting apparatus of claim 1, wherein the light source is an organic emissive structure.

5. The lighting apparatus of claim 1, wherein the phosphor composition is coated on the surface of the light source.

6. The lighting apparatus of claim 1, further comprising an encapsulant surrounding the light source and the phosphor composition.

7. The lighting apparatus of claim 6, wherein the phosphor composition is dispersed in the encapsulant.

8. The lighting apparatus of claim 1, further comprising a reflector cup.

9. The lighting apparatus of claim 1, wherein said phosphor composition comprises $(Y_{0.49}Gd_{0.48}Ce_{0.03})_3(MgSi)_{1.5}Al_2O_{12}$.

10. The lighting apparatus of claim 1, wherein said phosphor composition further comprises one or more additional phosphor.

11. The lighting apparatus of claim 10, wherein said one or more additional phosphors are selected from the group consisting of $(Ba,Sr,Ca)_5(PO_4)_3(Cl,F,Br,OH):Eu^{2+},Mn^{2+},Sb^{3+}$; $(Ba,Sr,Ca)MgAl_{10}O_{17}:Eu^{2+},Mn^{2+}$; $(Ba,Sr,Ca)BPO_5:Eu^{2+},Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $Ba_3MgSi_2O_8:Eu^{2+}$; $Sr_4Al_{14}O_{25}:Eu^{2+}$; $BaAl_8O_{13}:Eu^{2+}$; $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4Cl_2:Eu^{2+},Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Ba,Sr)_2(Ca,Mg,Zn)B_2O_6:K,Ce,Tb$; $(Sr,Ca,Ba,Mg,Zn)_2P_2O_7:Eu^{2+},Mn^{2+}$; $(Ca,Sr,Ba,Mg)_{10}(PO_4)_6(F,Cl,Br,OH):Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+}$; $SrY_2S_4:Eu^{2+}$; $CaLa_2S_4:Ce^{3+}$; $3.5MgO*0.5MgF_2*GeO_2:Mn^{4+}$; $(Ba,Sr,Ca)MgP_2O_7:Eu^{2+},Mn^{2+}$; $(Y,Lu)_2WO_6:Eu^{3+},Mo^{6+}$; $(Ba,Sr,Ca)_xSi_yN_z:Eu^{2+}$; and $(Sr,Ca,Ba)_3MgSi_2O_8:Eu^{2+},Mn^{2+}$.

12. The lighting apparatus of claim 1, further including a pigment, filter or other absorber capable of absorbing radiation generated between 250 nm and 450 nm.

13. The lighting apparatus of claim 1, wherein said lighting apparatus has a CCT value from about 2500 to 10,000.

14. The lighting apparatus of claim 1, wherein said lighting apparatus has a CRI value of from about 70 to 95.

15. A phosphor composition comprising $(Y_{1-x-y-z}Tb_xGd_yCe_z)_3(M_1M_2)_t(Al_{1-r-s}Ga_rIn_s)_{4-2t}O_{12+D}$, where $M_1$ is Mg or Zn, $M_2$ is Si or Ge, $0<x+y<1$, $0.01<z<0.1$, $0.1<t<1.5$, $0<r$, $s<0.5$, $4.5<A<5.0$, and $-1<D<1$.

16. The phosphor composition according to claim 15 comprising $(Y_{0.49}Gd_{0.48}Ce_{0.03})_3(MgSi)_{1.5}Al_2O_{12}$.

17. The phosphor composition according to claim 15, wherein said phosphor composition is capable of absorbing the radiation emitted by a light source emitting from 350-500 nm and emitting radiation that, when combined with said radiation from said light source, produces white light.

18. A phosphor blend including a first phosphor having the formula $(Y_{1-x-y-z}Tb_xGd_yCe_z)_3(M_1M_2)_t(Al_{1-r-s}Ga_rIn_s)_{4-2t}O_{12+D}$, where $M_1$ is Mg or Zn, $M_2$ is Si or Ge, $0<x+y<1$, $0.01<z<0.1$, $0.1<t<1.5$, $0<r$, $s<0.5$, $4.5<A<5.0$, and $-1<D<1$, and a TAG:Ce phosphor.

19. The phosphor blend according to claim 17, comprising $(Y_{0.49}Gd_{0.48}Ce_{0.03})_3(MgSi)_{1.5}Al_2O_{12}$.

20. The phosphor blend according to claim 17, further comprising one or more additional phosphors.

21. The phosphor blend according to claim 20, wherein said one or more additional phosphors are selected from the group consisting of $(Ba,Sr,Ca)_5(PO_4)_3(Cl,F,Br,OH):Eu^{2+},Mn^{2+},Sb^{3+}$; $(Ba,Sr,Ca)MgAl_{10}O_{17}:Eu^{2+},Mn^{2+}$; $(Ba,Sr,Ca)BPO_5:Eu^{2+},Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $Ba_3MgSi_2O_8:Eu^{2+}$; $Sr_4Al_{14}O_{25}:Eu^{2+}$; $BaAl_8O_{13}:Eu^{2+}$; $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4Cl_2:Eu^{2+},Mn^{2+}$; $(Ba,Sr,Ca)_2SiO_4:Eu^{2+}$; $(Ba,Sr,Ca)_2$ $(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+},Mn^{2+}$; $Na_2Gd_2B_2O_7:Ce^{3+}, Tb^{3+}$; $(Ba,Sr)_2(Ca,Mg,Zn)B_2O_6:K,Ce,Tb$; $(Sr,Ca,Ba,Mg,Zn)_2P_2O_7:Eu^{2+},Mn^{2+}$; $(Ca,Sr,Ba,Mg)_{10}(PO_4)_6(F,Cl,Br,OH):Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+}$; $SrY_2S_4:Eu^{2+}$; $CaLa_2S_4Ce^{3+}$; $3.5MgO*0.5MgF_2*GeO_2:Mn^{4+}$; $(Ba,Sr,Ca)MgP_2O_7:Eu^{2+},Mn^{2+}$; $(Y,Lu)_2WO_6:Eu^{3+},Mo^{6+}$; $(Ba,Sr,Ca)_xSi_yN_z:Eu^{2+}$; and $(Sr,Ca,Ba)_3MgSi_2O_8:Eu^{2+},Mn^{2+}$.

* * * * *